(12) United States Patent
Ding et al.

(10) Patent No.: US 11,342,459 B2
(45) Date of Patent: May 24, 2022

(54) THIN FILM TRANSISTOR STRUCTURE, ARRAY SUBSTRATE AND METHOD FOR MANUFACTURING A THIN FILM TRANSISTOR STRUCTURE

(71) Applicant: BOE TECHNOLOGY GROUP CO., LTD., Beijing (CN)

(72) Inventors: Luke Ding, Beijing (CN); Zhanfeng Cao, Beijing (CN); Jingang Fang, Beijing (CN); Liangchen Yan, Beijing (CN); Ce Zhao, Beijing (CN); Dongfang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 133 days.

(21) Appl. No.: 16/430,706

(22) Filed: Jun. 4, 2019

(65) Prior Publication Data

US 2020/0066901 A1 Feb. 27, 2020
US 2021/0050442 A9 Feb. 18, 2021

(30) Foreign Application Priority Data

Aug. 22, 2018 (CN) .................. 201810959883.7

(51) Int. Cl.
*H01L 29/94* (2006.01)
*H01L 29/786* (2006.01)
*H01L 29/66* (2006.01)
*H01L 27/12* (2006.01)

(52) U.S. Cl.
CPC ...... *H01L 29/786* (2013.01); *H01L 29/66742* (2013.01); *H01L 27/1214* (2013.01)

(58) Field of Classification Search
CPC .................. H01L 29/786; H01L 29/66742
See application file for complete search history.

(56) References Cited

U.S. PATENT DOCUMENTS

2009/0261355 A1* 10/2009 Matsukizono .......... H01L 29/06
                                                              257/88
2017/0016930 A1* 1/2017 Qiu .................... G02F 1/1339

FOREIGN PATENT DOCUMENTS

| CN | 1870235 A   | 11/2006 |
| CN | 103646924 A | 3/2014  |
| CN | 104779301 A | 7/2015  |
| CN | 105047568 A | 11/2015 |
| CN | 105047675 A | 11/2015 |
| CN | 105047677 A | 11/2015 |

(Continued)

OTHER PUBLICATIONS

China Second Office Action, Application No. 201810959883.7, dated Sep. 29, 2020, 14 pps.: with English translation.

(Continued)

*Primary Examiner* — Samuel A Gebremariam
(74) *Attorney, Agent, or Firm* — Armstrong Teasdale LLP

(57) ABSTRACT

The disclosure relates to a thin film transistor structure, an array substrate, and a method for manufacturing a thin film transistor structure. The thin-film transistor structure includes a base substrate, a thin film transistor on the base substrate. Wherein the thin film transistor includes an active layer and a source/drain electrode on a side, facing towards the base substrate, of the active layer. Wherein the source/drain electrode has a protrusion protruding from an edge portion of the active layer in a direction parallel to a surface of the base substrate.

16 Claims, 5 Drawing Sheets

(56) References Cited

FOREIGN PATENT DOCUMENTS

CN  107093558 A  8/2017
CN  107369693 A  11/2017

OTHER PUBLICATIONS

China First Office Action, Application No. 201810959883.7, dated Mar. 16, 2020, 11 pps.: with English translation.

* cited by examiner

THIN FILM TRANSISTOR STRUCTURE, ARRAY SUBSTRATE AND METHOD FOR MANUFACTURING A THIN FILM TRANSISTOR STRUCTURE

CROSS REFERENCE TO RELATED APPLICATIONS

This patent application claims the benefit and priority of Chinese Patent Application No. 201810959883.7 filed on Aug. 22, 2018, the disclosure of which is incorporated by reference herein in its entirety as part of the present application.

BACKGROUND

The disclosure relates to a technical field of display. More specifically, the disclosure relates to a method for manufacturing a thin film transistor structure, an array substrate, and a method for manufacturing a thin film transistor structure.

Thin film transistors may include gate electrode, source/drain electrode, active layer, gate insulation layer, and so on. Thin film transistors are widely used in various display devices, such as liquid crystal displays, organic light-emitting diode displays, and so on.

BRIEF DESCRIPTION

Embodiments of the present disclosure provide a thin film transistor structure, an array substrate, and a method of manufacturing a thin film transistor structure.

An object of an embodiment of the disclosure is to provide a thin film transistor structure. The thin film transistor structure includes a base substrate, a thin film transistor on the base substrate, wherein the thin film transistor includes an active layer and a source/drain electrode on a side, facing towards the base substrate, of the active layer, and wherein the source/drain electrode has a protrusion protruding from an edge portion of the active layer in a direction parallel to a surface of the base substrate.

In an embodiment, the thin film transistor structure further includes an intermediate layer between the active layer and the base substrate. The intermediate layer has a groove on a side, facing towards the active layer, of the intermediate layer. Wherein the source/drain electrode is located in the groove. Wherein the top surface of the source/drain electrode is flush with a top surface of the active layer contacting the intermediate layer.

In an embodiment, a depth of the groove is in a range from 4000 angstroms to 6000 angstroms.

In an embodiment, the thin film transistor structure further includes an insulating layer on the thin-film transistor including an opening that exposes the protrusion and the edge portion.

In an embodiment, the thin film transistor structure further includes a conductive portion in the opening, wherein the conductive portion is in contact with the protrusion and the edge portion.

In an embodiment, the thin film transistor further includes a gate electrode on a side, away from the base substrate, of the active layer and a gate insulating layer between the gate electrode and the active layer.

In an embodiment, the intermediate layer includes a buffer layer.

In an embodiment, the intermediate layer includes an insulating layer, and the thin film transistor further includes a gate electrode located on a side, facing towards the base substrate, of the intermediate layer.

In an embodiment, the source/drain electrode includes a first source/drain electrode and a second source/drain electrode, wherein the conductive portion includes a first conductive portion connected to the first source/drain electrode and a second conductive portion connected to the second source/drain electrode, and wherein the first conductive portion functions as an anode of an OLED light-emitting device.

Another purpose of some embodiments of the disclosure is to provide an array substrate. The array substrate includes a thin film transistor structure as described above.

Another purpose of some embodiments of the disclosure is to provide a method for manufacturing a thin film transistor structure. The method for manufacturing a thin film transistor structure includes forming an intermediate layer on a base substrate, forming a groove on a side, away from the base substrate, of the intermediate layer, forming a source/drain electrode of the thin film transistor in the groove, and forming an active layer of the thin film transistor on the intermediate layer. Wherein the source/drain electrode has a protrusion protruding from an edge portion of the active layer in a direction parallel to a surface of the base substrate.

In an embodiment, a top surface of the source/drain electrode is formed to be flush with a top surface of the intermediate layer contacting the active layer.

In an embodiment, the method further includes forming an insulating layer on the active layer and the intermediate layer, forming an opening in the insulation layer to expose the edge portion of the active layer and the protrusion of the source/drain electrode, and forming a conductive portion, covering the edge portion of the active layer and the protrusion, in the opening.

In an embodiment, the method further includes, after forming the active layer and prior to forming the insulating layer, forming a gate insulation layer on the active layer, and forming a gate electrode on the gate insulation layer.

In an embodiment, the method further includes, prior to forming the intermediate layer, forming a gate electrode on the base substrate, and wherein the intermediate layer comprises an insulating layer.

BRIEF DESCRIPTION OF THE DRAWINGS

To describe the technical solutions in the embodiments of the present disclosure more clearly, the accompanying drawings of the embodiments are briefly described below. It should be understood that the drawings described below refer only to some embodiments of the present disclosure, and not to restrict the present disclosure, wherein.

DETAILED DESCRIPTION

Figure 1:
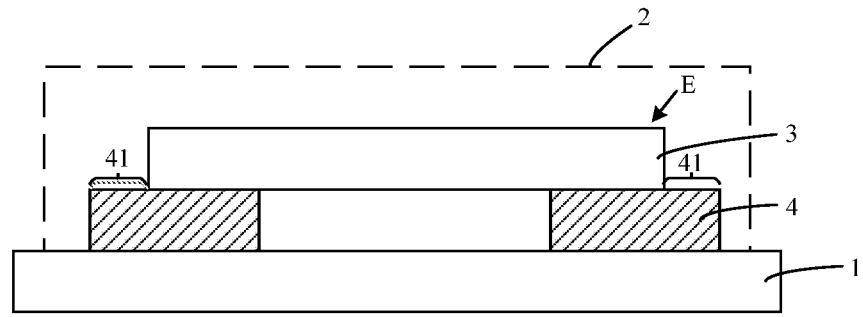
FIG. 1 is a schematic view of a thin film transistor structure according to an embodiment of the present disclosure.

In order to make the technical solutions and advantages of the embodiments of the present disclosure more comprehensible, the technical solutions of the embodiments of the present disclosure are clearly and completely described below with reference to the accompanying drawings. Obviously, the described embodiments are only a part but not all of the embodiments of the present disclosure. Based on the described embodiments of the present disclosure, all other embodiments obtained by those skilled in the art without creative efforts shall further fall within the protection scope of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. For purposes of the description, hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "contact" means that a first element, such as a first structure, and a second element, such as a second structure, are connected with or without any intermediary elements at the interface of the two elements.

FIG. 1 is a schematic view of a thin film transistor structure according to some embodiments of the present disclosure. As shown in FIG. 1, the thin film transistor structure according to embodiments of the present disclosure includes a base substrate 1, a thin film transistor located on the base substrate 1. The thin film transistor 2 includes an active layer 3 and a source/drain electrode 4 located on a side of the active layer 3 facing the base substrate 1. By such a source/drain electrode 4 below the active layer 3, the source/drain contact resistance can be reduced by potentially increasing the contact area between other conductive structures and the source/drain region. There also is a possibility of eliminating the segment difference (that is, the height difference) of the subsequent layer caused by the relative thicker source/drain electrode.

As shown in FIG. 1, the source/drain electrode 4 may further have a protrusion 41 protruding from an edge portion E of the active layer 3 in a direction parallel to a surface of the base substrate 1. With such a setting, when a hole for a conductive structure connected to the source/drain region is subsequently formed, the hole can be aligned not only with the source and drain region of the active layer, but further with the protrusion. Thus, the alignment difficulty between the hole and the source/drain region can be reduced. In addition, the conductive structure (for example, the conductive portion 7 in FIG. 4) and the source/drain electrode cover the active layer from both sides of the active layer, thus increasing the contact area with the source/drain region of the active layer and reducing the contact resistance of the source/drain contact.

Figure 2:
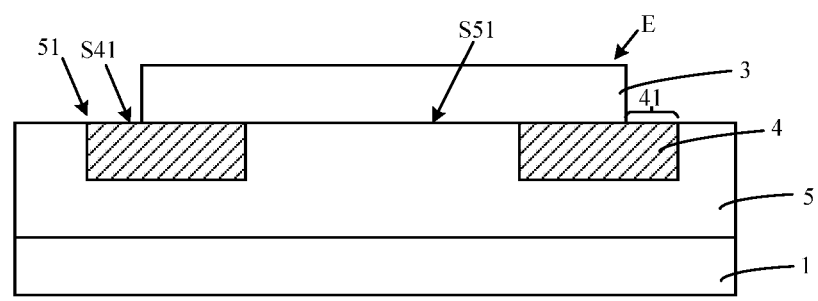
FIG. 2 is a schematic view of a thin film transistor structure according to an embodiment of the present disclosure.

FIG. 2 is a schematic view of a thin film transistor structure according to some embodiments of the present disclosure. As shown in FIG. 2, the thin film transistor structure according to embodiments of the present disclosure may further include an intermediate layer 5 between the active layer 3 and the base substrate 1. The intermediate layer 5 has a groove 51 on a side thereof facing the active layer 3. The source/drain electrode 4 is located in the groove 51. A top surface S41 of the source/drain electrode 4 is flush with a top surface S51 of the intermediate layer 5 contacting the active layer 3. The "top surface" here refers to a surface away from the base substrate 1, and "flush with" refers to the surfaces are on the same plane. Due to that the top surface S41 of the source/drain electrode 4 is flush with the top surface S51 of the intermediate layer 5 contacting the active layer 3, the segment difference of the layer formed on the source/drain electrode 4 can be eliminated.

In an embodiment, the depth of the groove 51 may be about 4000-6000 angstroms. The source/drain electrode 4 may include a metal, for example, copper or aluminum. The active layer 3 may include an oxide semiconductor.

Figure 3:
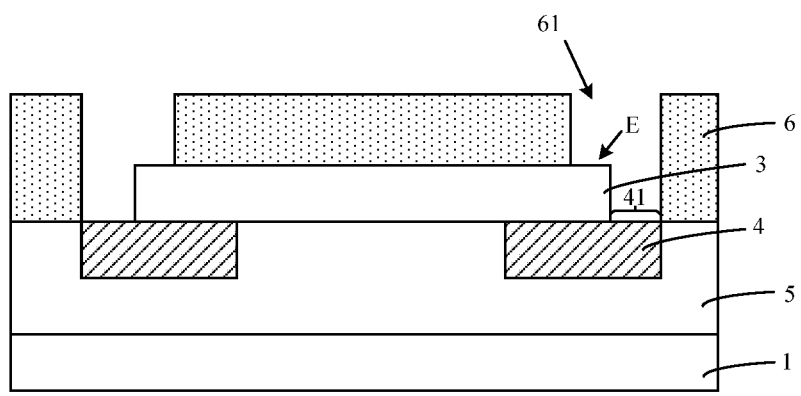
FIG. 3 is a schematic view of a thin film transistor structure according to an embodiment of the present disclosure.

FIG. 3 is a schematic view of a thin film transistor structure according to some embodiments of the present disclosure. As shown in FIG. 3, the thin film transistor structure according to some embodiments of the present disclosure may further include an insulating layer 6 located on the thin film transistor. The insulation layer has an opening 61. The opening 61 exposes the protrusion 41 of the source/drain electrode 4 and the edge portion E of the active layer 3.

Figure 4:
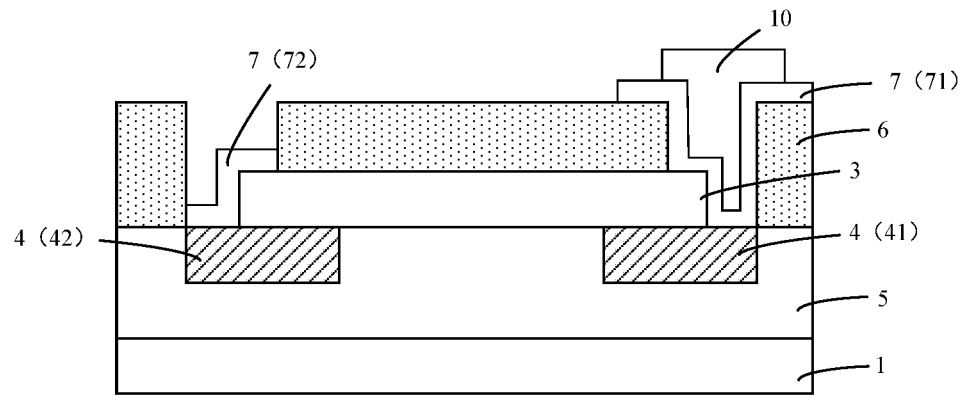
FIG. 4 is a schematic view of a thin film transistor structure according to an embodiment of the present disclosure.

FIG. 4 is a schematic view of a thin film transistor structure according to some embodiments of the present disclosure. As shown in FIG. 4, the thin film transistor structure according to some embodiments of the present disclosure may further include a conductive portion 7 located in the opening 61. The conductive portion 7 is in contact with the protrusion 41 of the source/drain electrode 4 and the edge portion E of the active layer 3.

The source/drain electrode 4 may include a first source/drain electrode 41 and a second source/drain electrode 42. The conductive portion may include a first conductive portion 71 connected to the first source/drain electrode 41 and a second conductive portion 72 connected to the second source/drain electrode 42. The first conductive portion 71 may be used as an electrode (for example, an anode) of the luminous structure 10 (e.g., OLED light-emitting device) thereon.

Figure 5:
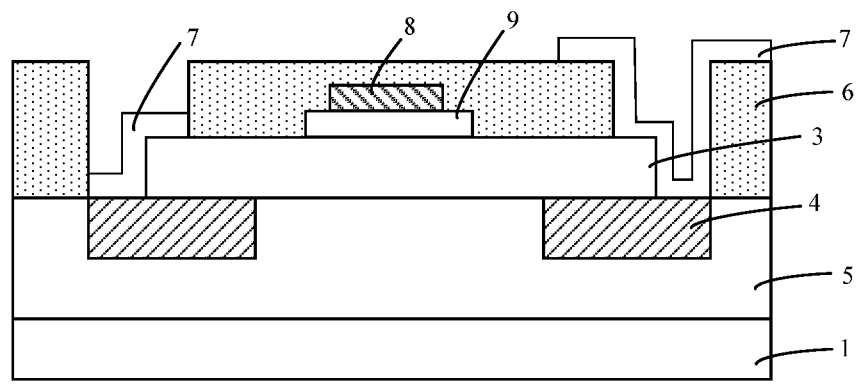
FIG. 5 is a schematic view of a thin film transistor structure according to an embodiment of the present disclosure.

FIG. 5 is a schematic view of a thin film transistor structure according to some embodiments of the present disclosure. As shown in FIG. 5, the thin film transistor structure according to some embodiments of the disclosure may further include a gate electrode 8 located on a side of the active layer 3 away from the base substrate 1 and a gate insulation layer 9 located between the gate electrode 8 and the active layer 3. It is understandable that in this case, the thin film transistor is a top gate structure. The intermediate layer 5 may include a buffer layer. The material of the buffer layer may include at least one of the following: silica, organosilicon, and materials that can be used as black matrix.

Figure 6:
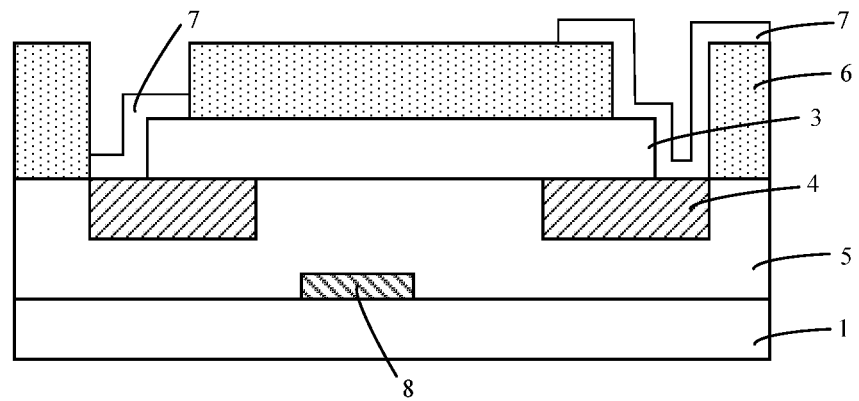
FIG. 6 is a schematic view of a thin film transistor structure according to an embodiment of the present disclosure.

FIG. 6 is a schematic view of a thin film transistor structure according to some embodiments of the present disclosure. As shown in FIG. 6, the thin film transistor structure according to some embodiments of the present disclosure further includes a gate electrode 8 located on a side of the intermediate layer 5 facing the base substrate 1. In this case, the intermediate layer 5 includes an insulating layer.

The embodiments of the disclosure further provide an array substrate.

Figure 7:
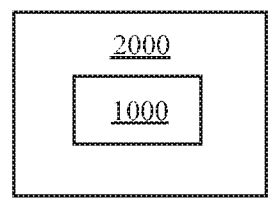
FIG. 7 is a schematic view of an array substrate according to an embodiment of the present disclosure.

FIG. 7 is a schematic view of an array substrate according to some embodiments of the present disclosure. As shown in FIG. 7 the array substrate 2000 according to some embodiments of the present disclosure may include a thin film transistor structure 1000 as described above. The thin film transistor structure 1000 may include an array substrate as shown in FIG. 1-FIG. 6.

The embodiments of the disclosure further provide a method for manufacturing of a thin film transistor structure.

Figure 8:
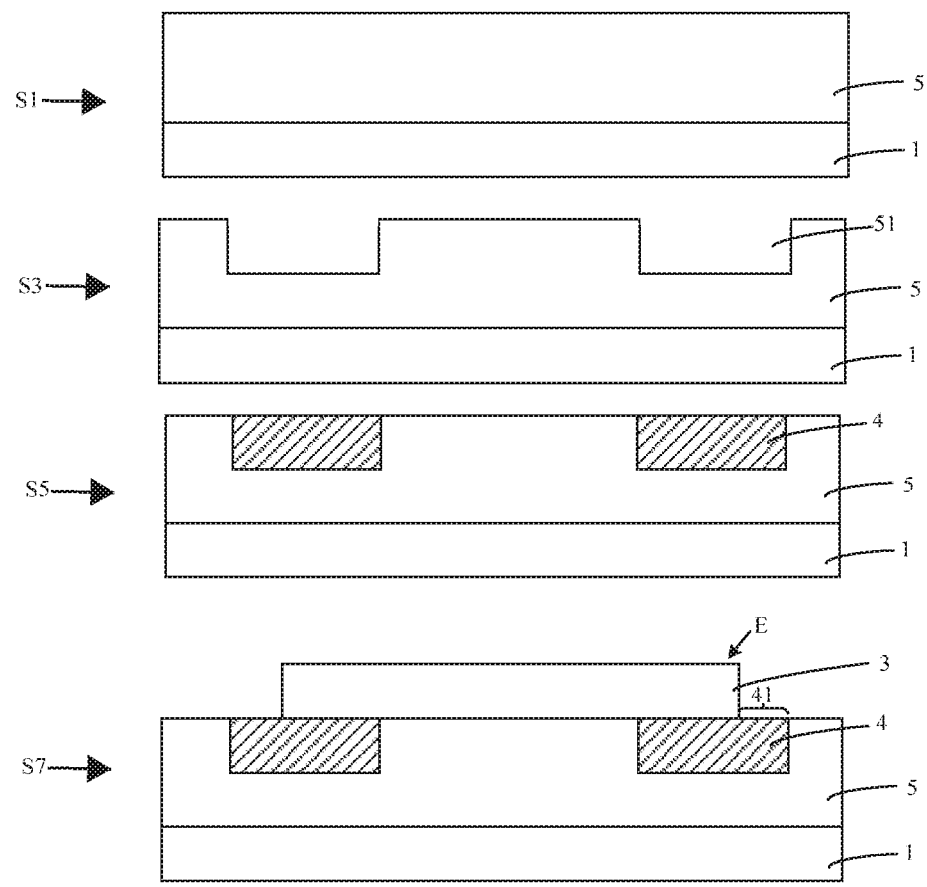
FIG. 8 is a schematic view of a method for manufacturing a thin film transistor structure according to an embodiment of the present disclosure.

FIG. 8 is a schematic view of a method for manufacturing of a thin film transistor structure according to some embodiments of the present disclosure. As shown in FIG. 8, the method for manufacturing of a thin film transistor structure according to some embodiments of the present disclosure includes:

S1, forming an intermediate layer 5 on a base substrate 1;

S3, forming a groove 51 on a side, away from the base substrate 1, of the intermediate layer 5;

S5, forming a source/drain electrode 4 of the thin film transistor in the groove 51; and S7, forming an active layer 3 of the thin film transistor on the intermediate layer 5, wherein the source/drain electrode 4 has a protrusion 41 protruding from an edge portion E of the active layer 3 in a direction parallel to a surface of the base substrate 1.

The method for manufacturing a thin film transistor structure according to embodiments of the disclosure can facilitate the conductive connection to the source/drain electrode and reduce the source/drain contact resistance, as well as reduce the alignment difficulty between the subsequently formed hole and the source/drain region.

The top surface of the source/drain electrode 4 can be formed as flush with the top surface of the intermediate layer 5 contacting the active layer 3. Because the top surface S41 of the source/drain electrode 4 is flush with the top surface S51 of the intermediate layer 5 contacting the active layer 3, the segment difference of the layers formed on the source/drain electrode 4 can be eliminated.

Figure 9:
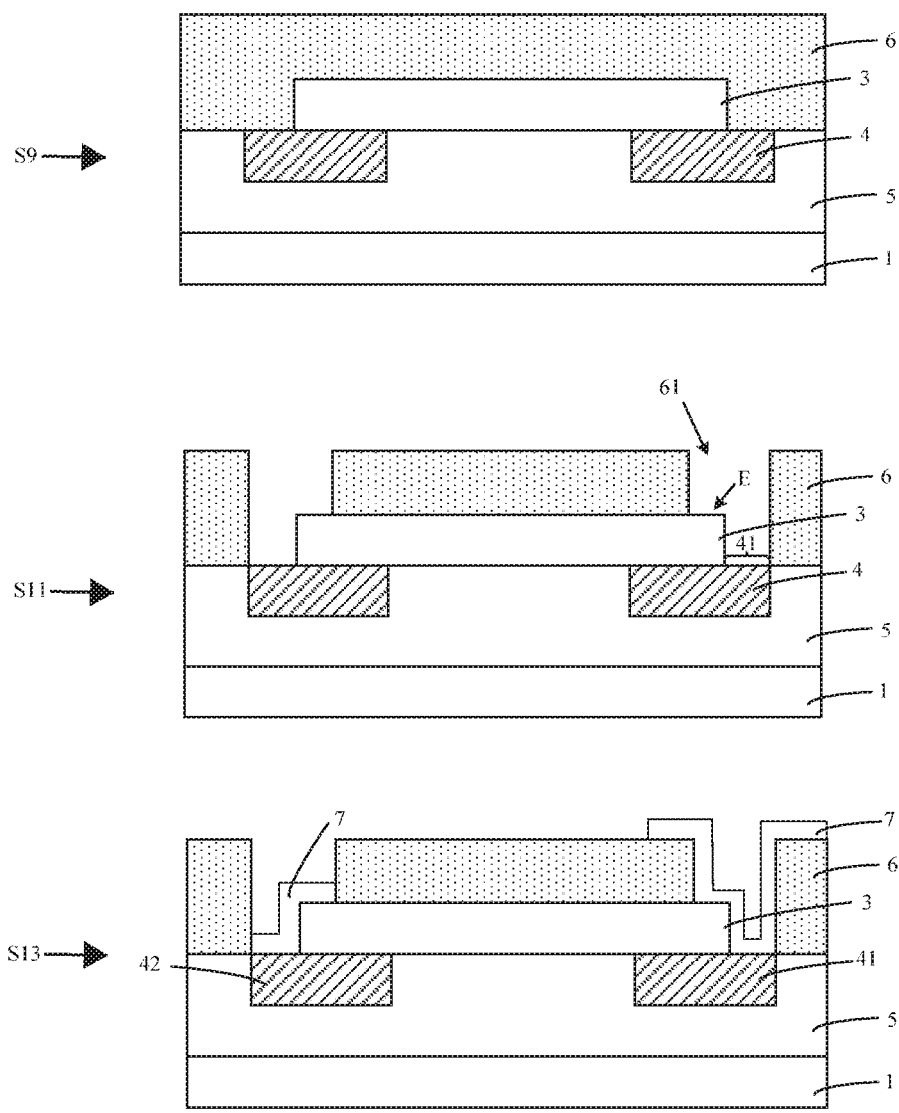
FIG. 9 is a schematic view of a method for manufacturing a thin film transistor structure according to an embodiment of the present disclosure.

FIG. 9 is a schematic view of a method for manufacturing of a thin film transistor structure according to some embodiments of the present disclosure. As shown in FIG. 9, the method can further include:

S9, forming an insulating layer 6 on the active layer 3 and the intermediate layer 5;

S11, forming an opening 61 in the insulation layer 6 to expose the edge portion E of the active layer 3 and the protrusion 41 of the source/drain electrode 4; and S13, forming a conductive portion 7, covering the edge portion E of the active layer 3 and the protrusion 41, in the opening 61.

Figure 10A:
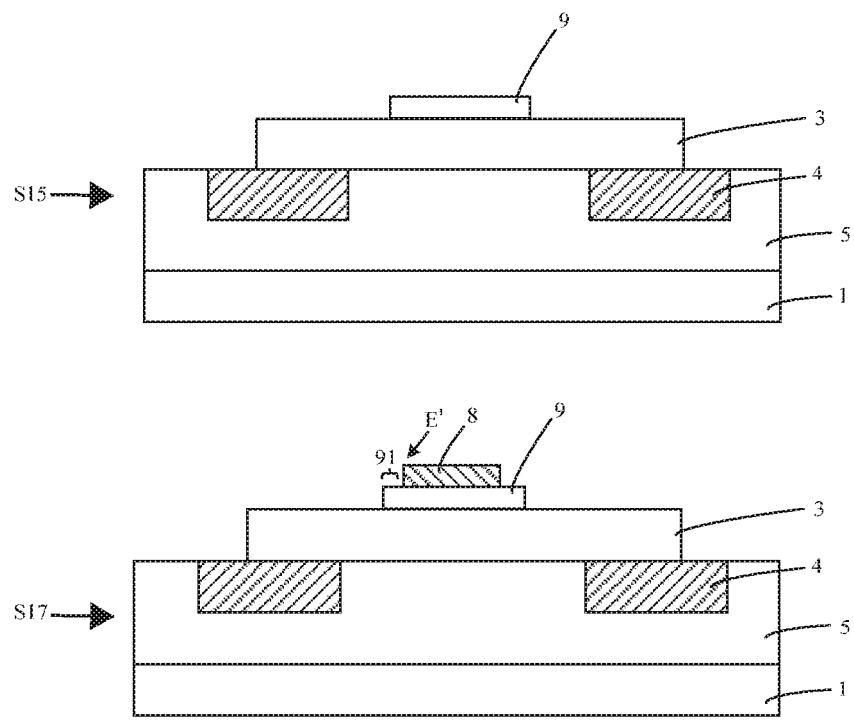
FIG. 10A is a schematic view of a method for manufacturing a thin film transistor structure according to an embodiment of the present disclosure.

FIG. 10A is a schematic view of a method for manufacturing a thin film transistor structure according to some embodiments of the present disclosure. As shown in FIG. 10A, the method further includes after forming the active layer 3 and prior to forming the insulating layer 6:

S15, forming a gate insulation layer 9 on the active layer 3; and

S17, forming a gate electrode 8 on the gate insulation layer 9.

In particular, the insulating layer may be deposited on the active layer 3 (for example, an oxide semiconductor layer), and then the gate electrode layer (for example, a metal layer) may be deposited on the insulating layer. The gate electrode layer is etched by mask (for example, wet method) to form the gate electrode. The mask can continue to be used to etch the insulation layer (for example, dry method) to form the gate insulation layer. Wet etch has side etch while dry etch does not. Therefore, although being etched using the same mask, the width of the formed gate electrode 8 is different from that of the gate insulation layer 9. Thus, the gate insulation layer 9 has a protrusion part 91 protruding from an edge part E' of the gate electrode 8 in a direction parallel to a surface of the base substrate 1. After dry etch, conductive treatment (for example, plasma treatment) may be performed on the active layer to conduct the region of the non-channel region of the active layer. It should be understood that, depending on the specific process adopted, the gate insulation layer may not have the protrusion part 91.

Figure 10B:
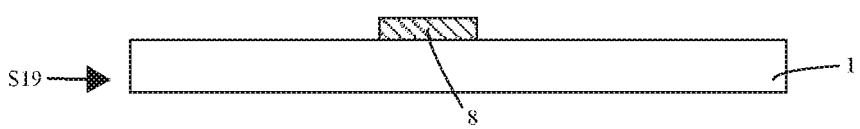
FIG. 10B is a schematic view of a method for manufacturing a thin film transistor structure according to an embodiment of the present disclosure.

FIG. 10B is a schematic view of a method for manufacturing a thin film transistor structure according to some embodiments of the present disclosure. As shown in FIG. 10B, the method further includes, prior to forming the intermediate layer 5:

S19, forming a gate electrode 8 on the base substrate 1, and wherein the intermediate layer comprises an insulating layer.

Having described certain specific embodiments, these embodiments have been presented by way of example only, and are not intended to limit the scope of the present disclosure. Indeed, the novel embodiments described herein may be embodied in various other forms; forms, furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A thin-film transistor structure comprising:
   a base substrate;
   an intermediate layer on the base substrate;
   a thin film transistor on the intermediate layer, wherein the thin film transistor comprises an active layer and a source/drain electrode, wherein the intermediate layer comprises a groove on a side, facing towards the active layer, of the intermediate layer, wherein the source/drain electrode is located in the groove, wherein the source/drain electrode has a protrusion protruding from an edge portion of the active layer in a direction parallel to a surface of the base substrate, wherein a projection of the active layer on the base substrate overlaps with a projection of the source/drain electrode, and wherein the active layer is in contact with the source/drain electrode;

a gate electrode on a side, away from the base substrate, of the active layer, wherein a projection of the gate electrode on the base substrate is within a projection of the active layer on the base substrate; and a gate insulating layer between the gate electrode and the active layer, wherein a projection of the gate insulating layer is within the projection of the active layer on the base substrate.

2. The thin film transistor structure according to claim 1, wherein a first surface of the source/drain electrode is flush with a first surface of the intermediate layer, wherein the first surface of the source/drain electrode is facing away from the base substrate, and wherein the first surface of the intermediate layer contacts the active layer.

3. The thin film transistor structure according to claim 2, wherein a depth of the groove is in a range from 4000 angstroms to 6000 angstroms.

4. The thin-film transistor structure according to claim 3, wherein the thin-film transistor further comprises a gate electrode on the side, away from the base substrate, of the active layer and a gate insulating layer between the gate electrode and the active layer.

5. An array substrate comprising comprises a thin-film transistor structure according to claim 3.

6. The thin film transistor structure according to claim 2, wherein the intermediate layer comprises an insulating layer.

7. The thin-film transistor structure according to claim 2, wherein the thin-film transistor further comprises a gate electrode on the side, away from the base substrate, of the active layer and a gate insulating layer between the gate electrode and the active layer.

8. An array substrate comprising a thin-film transistor structure according to claim 2.

9. The thin film transistor structure according to claim 1, wherein the intermediate layer comprises a buffer layer.

10. The thin film transistor structure according to claim 1, wherein the source/drain electrode comprises a first source/drain electrode and a second source/drain electrode, wherein a conductive portion comprises a first conductive portion connected to the first source/drain electrode and a second conductive portion connected to the second source/drain electrode, and wherein the first conductive portion functions as an anode of an OLED light-emitting device.

11. An array substrate comprising a thin-film transistor structure according to claim 1.

12. The thin-film transistor structure according to claim 1, wherein the thin-film transistor further comprises a gate electrode on the side, away from the base substrate, of the active layer and a gate insulating layer between the gate electrode and the active layer.

13. The thin-film transistor structure according to claim 1, wherein the thin-film transistor further comprises a gate electrode on the side, away from the base substrate, of the active layer and a gate insulating layer between the gate electrode and the active layer.

14. The thin-film transistor structure according to claim 1, wherein a projection of the protrusion on the base substrate does not overlap with the projection of the active layer on the base substrate, and wherein the thin-film transistor structure further comprises:

an insulating layer on the thin film transistor, wherein the insulating layer includes an opening, the opening exposes at least the protrusion and the edge portion;

a conductive portion in the opening, wherein the conductive portion is in contact with the protrusion and the edge portion.

15. The thin-film transistor structure according to claim 14, wherein the opening further exposes the active layer, the conductive portion comprises the source/drain electrode, and the source/drain electrode comprises a first source/drain electrode and a second source/drain electrode, wherein the conductive portion comprises a first conductive portion connected to the first source/drain electrode and a second conductive portion connected to the second source/drain electrode.

16. The thin film transistor structure according to claim 1, further comprising an insulating layer on the thin-film transistor, wherein the insulating layer includes an opening that exposes the protrusion and the edge portion.

* * * * *

UNITED STATES PATENT AND TRADEMARK OFFICE
CERTIFICATE OF CORRECTION

| | |
|---|---|
| PATENT NO. | : 11,342,459 B2 |
| APPLICATION NO. | : 16/430706 |
| DATED | : May 24, 2022 |
| INVENTOR(S) | : Luke Ding et al. |

It is certified that error appears in the above-identified patent and that said Letters Patent is hereby corrected as shown below:

In the Claims

In Claim 5, Column 7, Line 23, delete "substrate comprising comprises a thin-film" and insert therefor -- substrate comprising a thin-film --.

Signed and Sealed this
Second Day of August, 2022

Katherine Kelly Vidal
*Director of the United States Patent and Trademark Office*